(12) United States Patent
Haridass et al.

(10) Patent No.: US 11,914,000 B2
(45) Date of Patent: Feb. 27, 2024

(54) LEAKAGE CURRENT DETECTION IN CABLE TRAY

(71) Applicant: Eaton Intelligent Power Limited, Dublin (IE)

(72) Inventors: Anish Haridass, Tamilnadu (IN); Guruprasad Narayan Solapurkar, Pune (IN); Hemraj Keda Thorat, Pune (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 17/686,866

(22) Filed: Mar. 4, 2022

(65) Prior Publication Data

US 2022/0283214 A1 Sep. 8, 2022

Related U.S. Application Data

(60) Provisional application No. 63/157,084, filed on Mar. 5, 2021.

(51) Int. Cl.
*G01R 31/52* (2020.01)
*H02G 3/04* (2006.01)
*G01R 31/58* (2020.01)

(52) U.S. Cl.
CPC .......... *G01R 31/52* (2020.01); *G01R 31/58* (2020.01); *H02G 3/0406* (2013.01)

(58) Field of Classification Search
CPC ...... G01R 31/085; G01R 31/52; G01R 31/58; G01R 29/0814; H02G 3/0406
See application file for complete search history.

(56) References Cited

U.S. PATENT DOCUMENTS 4,059,798 A * 11/1977 Dierker ............... G01R 33/025
324/225
6,833,713 B2 * 12/2004 Schoepf ................. H02H 3/30
702/58

(Continued)

FOREIGN PATENT DOCUMENTS

CN 102004203 A 4/2011
CN 102361317 B 1/2013

(Continued)

OTHER PUBLICATIONS

Extended European Search Report from EP Application No. 22160289.9, dated Jul. 26, 2022, 8 pages.

*Primary Examiner* — Feba Pothen
*Assistant Examiner* — James Split
(74) *Attorney, Agent, or Firm* — Stinson LLP

(57) ABSTRACT

A leakage detector is used with a cable tray run configured to support one or more electrical cables. The leakage detector includes an electrical conductor extending around the cable tray run generally transverse to a length of the cable tray run. A magnetic sensor is coupled to the electrical conductor. In use the leakage detector is configured to sense magnetic flux generated by current flowing through the one or more electrical conductors adjacent the leakage detector. More than one leakage detector can be used in a leakage detection system. The leakage detection system may further include a central computing device to determine if there is leakage current from the one or more electrical conductor in the cable tray run based on signals received from the leakage detectors.

17 Claims, 5 Drawing Sheets

(56) References Cited

U.S. PATENT DOCUMENTS

| | | | |
|---|---|---|---|
| 6,909,977 B2* | 6/2005 | Orton | H02H 1/0023 |
| | | | 702/65 |
| 7,714,567 B2* | 5/2010 | Heger | G01R 33/04 |
| | | | 324/117 R |
| 7,755,346 B2* | 7/2010 | Tanizawa | G01R 31/364 |
| | | | 324/117 H |
| 9,244,110 B2 | 1/2016 | Ward | |
| 9,297,864 B2* | 3/2016 | Cortes | G01R 33/0011 |
| 2006/0232902 A1* | 10/2006 | Woolsey | G01R 15/202 |
| | | | 361/93.1 |
| 2011/0260735 A1* | 10/2011 | McCabe | G01R 31/58 |
| | | | 324/543 |
| 2012/0215469 A1 | 8/2012 | Serra et al. | |
| 2014/0009146 A1 | 1/2014 | Blagojevic et al. | |
| 2016/0025794 A1 | 1/2016 | Kim | |

FOREIGN PATENT DOCUMENTS

| | | | |
|---|---|---|---|
| CN | 105759102 A | * | 7/2016 |
| CN | 108548993 A | | 9/2018 |
| CN | 212486021 U | | 2/2021 |
| KR | 20130057176 A | * | 11/2011 |

* cited by examiner

LEAKAGE CURRENT DETECTION IN CABLE TRAY

REFERENCE TO RELATED APPLICATIONS

This application claims the benefit of U.S. Provisional Patent Application No. 63/157,084, filed Mar. 5, 2021, the contents of which are incorporated herein by reference.

FIELD

The present disclosure generally relates to leakage current detection system for cable trays.

BACKGROUND

Electrical wirings (cables) are routed through cable trays from one end to another. At present, if any of wire damage (e.g., wear out insulation) then current leaks out through cable tray. Often, cables are tied and pass through trays. Also these cable trays are mounted at certain height from the ground which makes challenging to physically detect the wire damage.

SUMMARY

In one aspect, a cable tray assembly generally comprises a cable tray run having a length. The cable tray run is configured to support one or more electrical conductors. A first leakage detector is disposed at a first longitudinal location of the cable tray run. The first leakage detector includes a first magnetic sensor. In use the first leakage detector is configured to sense magnetic flux generated by current flowing through the one or more electrical conductors adjacent the first leakage detector. A second leakage detector is disposed at a second longitudinal location of the cable tray run. The second leakage detector includes a second magnetic sensor. In use the second leakage detector is configured to sense magnetic flux generated by current flowing through the one or more electrical conductors adjacent the second leakage detector. The first and second longitudinal locations are spaced apart from one another along the lengths of the cable tray.

In another aspect, a leakage detection system for use with a cable tray run configured to support one or more electrical cables generally comprises a first leakage detector configured to be disposed at a first longitudinal location of the cable tray run. The first leakage detector including a first magnetic sensor. In use the first leakage detector is configured to sense magnetic flux generated by current flowing through the one or more electrical conductors adjacent the first leakage detector. A second leakage detector is configured to be disposed at a second longitudinal location of the cable tray run. The second leakage detector includes a second magnetic sensor. In use the second leakage detector is configured to sense magnetic flux generated by current flowing through the one or more electrical conductors adjacent the second leakage detector. A central computing device is configured to receive: i) a first signal from the first leakage detector indicative of the magnetic flux generated by current flowing through the one or more electrical conductors adjacent the first leakage detector, and ii) a second signal from the second leakage detector indicative of the magnetic flux generated by current flowing through the one or more electrical conductors adjacent the second leakage detector. The central computing device is configured to compare the first and second signals to determine if there is leakage current from the one or more electrical conductor in the cable tray run.

In yet another aspect, a leakage detector for use with a cable tray run configured to support one or more electrical cables generally comprises an electrical conductor configured to extend around the cable tray run generally transverse to a length of the cable tray run. A magnetic sensor is coupled to the electrical conductor. In use the second leakage detector is configured to sense magnetic flux generated by current flowing through the one or more electrical conductors adjacent the leakage detector.

Other objects and features will be in part apparent and in part pointed out herein.

DETAILED DESCRIPTION

Electrical distribution systems in factories, residential buildings, and other application typically utilize cable trays to carry over-hanging cables and wall routed cables. Cable trays may also be referred to as cable conduits or cable ducts. Due to environmental factors or overheating, for example, insulation of cables may become weakened such that current begins to leak through the metallic cable trays. Leakage can occur anywhere in the cable system, and cable trays are often mounted at a certain height from the ground, making it challenging to physically detect wire damage. Locating a leakage location is important to shut down a specific area for maintenance and avoid a system wide outage for maintenance. Accurate location of leakage will make repairs quicker and reduce man power effort in identification of the leakage location.

In general, the present disclosure is directed to a leakage current detection system configured to facilitate identification of a location of leakage current along a cable tray run. The incorporation of the leakage current detection system makes the cable tray "smart," whereby the leakage current detection system can identify the location of the damaged cable and communicate the location to an operator/technician.

Figure 1:
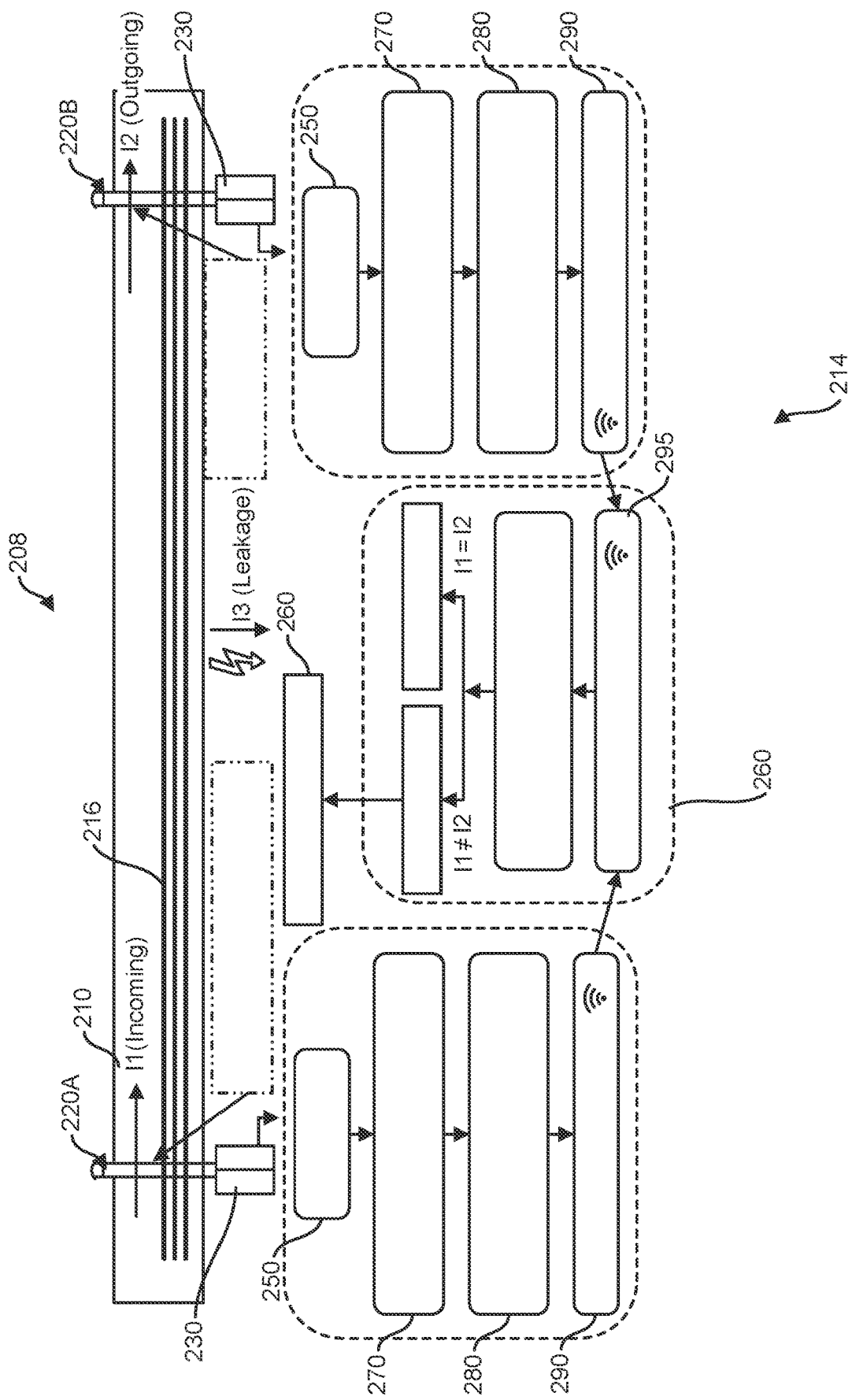
FIG. 1 is a schematic representation of the cable tray assembly including a leakage current detection system.

Referring to FIG. 1, a cable tray assembly constructed according to the teachings of the present disclosure is generally indicated at reference numeral 208. As described below, the cable tray assembly 208 includes a cable tray 210 (or run of cable tray) and a leakage current detection system, generally indicated at 214, configured to detect leakage current emitting from the one or more electrical cables 216 (or other electrical conductors) within the cable tray and communicate the same to an operator/technician. The cable tray 210 may be a conventional cable tray, such as but not limited to a wire basket-type or ladder-type cable tray. The leakage current detection system 214 may be retrofitted on existing cable tray runs 210 after installation of the latter, or components of the leakage detection may be installed on the cable tray(s) before installation.

Figure 2:
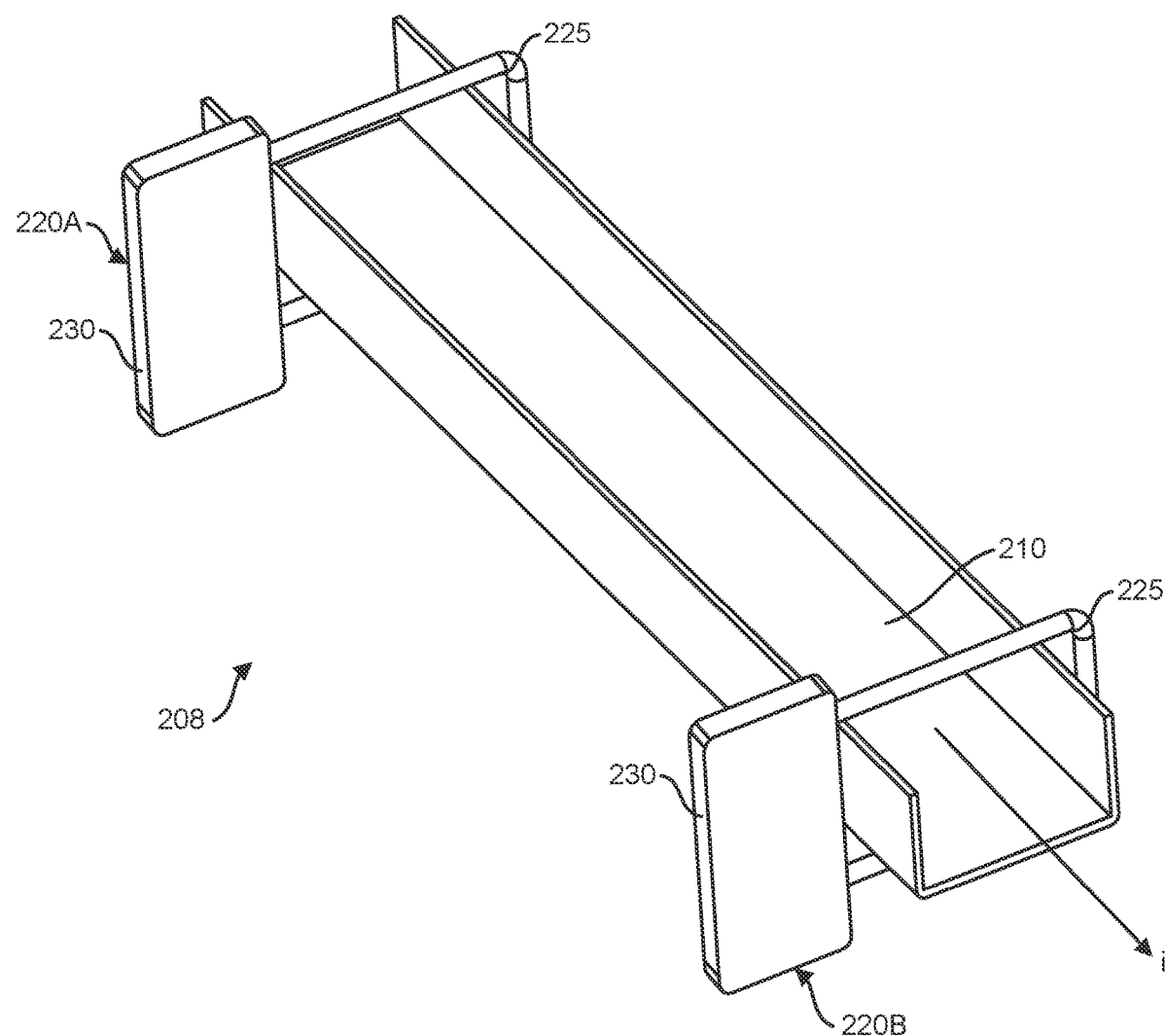
FIG. 2 is a perspective of a cable tray assembly including a leakage detector of a leakage current detection system.
Figure 3:
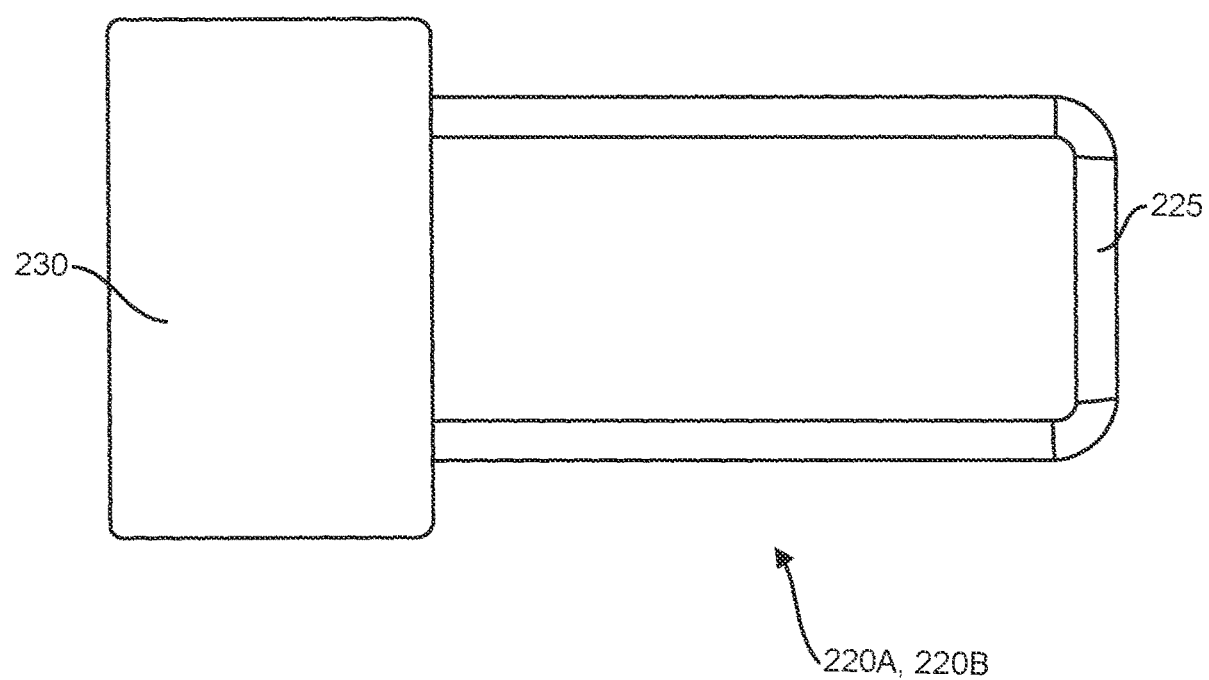
FIG. 3 is a schematic of a leakage detector including the Hall-effect sensor for a 6" wide tray.
Figure 4:
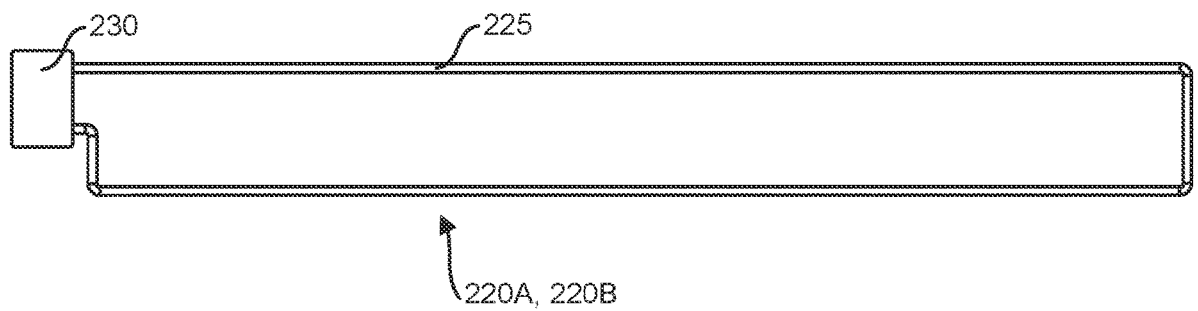
FIG. 4 is a schematic of a leakage detector including the Hall-effect sensor for a 36" wide tray.
Figure 5:
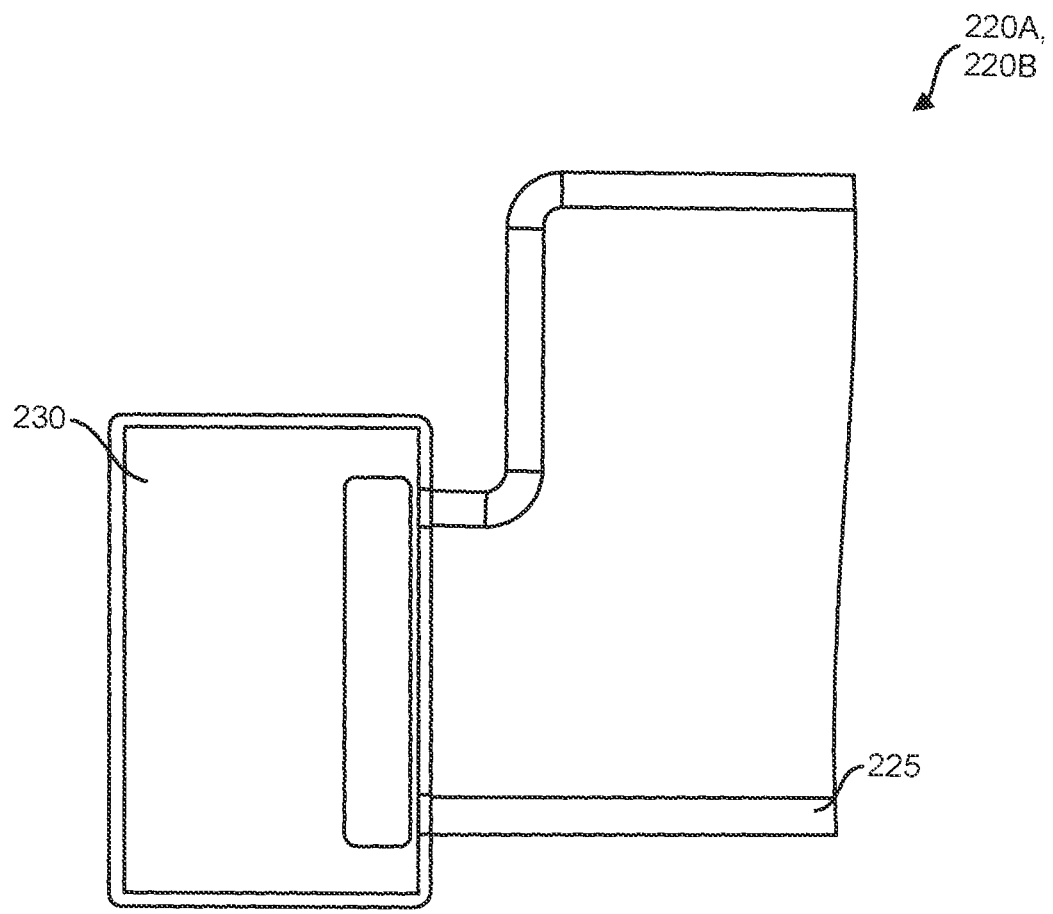
FIG. 5 is an enlarged, schematic detail of the of a leakage detector.

Referring to FIGS. 1 and 2, the illustrated leakage detection system 214 includes two (or more) leakage detectors generally indicated at 220A, 220B, respectively, spaced apart from one another along a length of the cable tray run 210 in the direction of current flowing through the cables 216 supported by the cable tray run. It is understood that the leakage detection system 214 may include any number of the leakage detectors 220A, 22B, and it is anticipated that in most cases the system will include numerous leakage detectors. Other than location on the cable tray run 210, the leakage detectors 220A, 220b may be identical, and therefore, like components are indicated by the same reference numerals in the drawings. Each of the leakage detectors 220A, 220B includes an electrical conductor 225 (e.g., an insulated electro conductor, such as an insulated wire), and a magnetic sensor 230 coupled to the electrical conductor and configured to detect a magnetic field. As shown in FIG. 2, the illustrated electrical conductor 225 may extend around the cable tray 210, such as in a loop, and have a length extending generally transverse to the lengths of the cable tray run 210. As shown in FIGS. 3 and 4, the length of the electrical conductor 225 or size of the loop may depend on the size of the cable tray 210. For instance, FIG. 3 illustrates a leakage detector for a 6" wide tray, while FIG. 4 illustrates a leakage detector for a 36" wide tray. Other suitable sizes are contemplated.

Referring to FIG. 1, the illustrated magnetic sensor 230 comprises a Hall-effect or Hall sensor 250. This sensor 250 works based on the Hall-effect principle, which is known to those having ordinary skill in the art. When a conductor or semiconductor with current flowing is introduced perpendicular to a magnetic field, a voltage could be measured at right angles to the current path. The Hall-effect sensor 250 provides a proportional voltage to the magnetic flux density applied on the sensor. As shown in FIG. 1 and described below, the magnetic sensor 230 may include other electrical components to implement the leakage current detection system 214 and communicate with a central computing device 260. Other types of sensors, other than the Hall-effect sensor, may be used for the magnetic sensor.

Operation of the leakage current detection system 214 during use is understood best with reference to FIG. 1. As shown in FIG. 1, the electrical cables 216 are supported by and within the cable tray run 210. Two of the leakage detectors 220A, 220B are coupled to the cable tray and are spaced apart along the length of the cable tray run. One of the leakage detectors is considered an incoming or upstream leakage detector 220A, since it detects incoming current I1 flowing into the longitudinal space between the leakage detectors, and the other is considered an outgoing or downstream leakage detector 220B, since it detects outgoing current I2 flowing out of the longitudinal space between the leakage detectors.

The incoming current I1 at the incoming leakage detector 220A generates a first magnetic flux, which is concentrated by the insulated iron wire 225 of the incoming leakage detector 220A. The flux is confined using the first insulated iron wire 225 surrounding the cable tray 210. The Hall-effect sensor 250 of the incoming leakage detector 220A senses a parameter (e.g., magnitude) of effective magnetic flux. In particular, the Hall-effect sensor 220A generates a voltage accordingly with respect to the effective magnetic flux. Overall, this signal or detection is transmitted to the central computing device 260, such as through a wireless or wired connection. In one example, the voltage signals from the Hall-effect sensor 250 are amplified and converted to a first DC current via a voltage amplifier and rectifier 270. If the electrical cable 216 is carrying AC current, the signal from the Hall-effect sensor 250 also will be in AC current. The converted DC signal is passed through an RC circuit 280 for stabilization. The stabilized signal from the RC circuit is converted to a digital signal through an Analog-to-Digital Converter (ADC) 280. This digital signal is transmitted to the central computing device 260 via wireless transmitter 290 (e.g., wireless transceiver), for example.

Similarly, the outgoing current I2 at the outgoing leakage detector 220B generates a second magnetic flux, which is concentrated by the insulated iron wire 225 of the outgoing leakage detector. The flux is confined using the insulated iron wire 225 of the outgoing leakage detector 220B surrounding the cable tray 210. The Hall-effect sensor 250 of the outgoing leakage detector 220B senses a parameter (e.g., magnitude) of effective magnetic flux. In particular, the Hall-effect sensor 220A generates a voltage accordingly with respect to the effective magnetic flux. Overall, this signal or detection is transmitted to the central computing device 260, such as through a wireless or wired connection. In one example, the voltage signals from the Hall-effect sensor 250 are amplified and converted to a DC current via a voltage amplifier and rectifier 270. If the electrical cable 216 is carrying AC current, the signal from the Hall-effect sensor 250 also will be in AC current. The converted DC signal is passed through an RC circuit 280 for stabilization. The stabilized signal from the RC circuit is converted to a digital signal through an Analog-to-Digital Converter (ADC) 280. This digital signal is transmitted to the central computing device 260 via wireless transmitter 290 (e.g., wireless transceiver), for example. Overall, the structure and operation of the first and second leakage detection sensors 220A, 220B may be the same.

The central computing device 260 includes readable memory and a processor for executing instructions stored in the readably memory. The computing device 260 receives the digital signals from the incoming and outgoing leakage detectors 220A, 220B, respectively, and may receive signals from other leakage detectors where applicable. For example, central computing device 260 may include a wireless receiver 295 (e.g., wireless transceiver) for receiving the wireless signals from the leakages sensors 220A, 220B. Suitable communication protocols include an LoRA protocol, a Zigbee protocol, or a BLE protocol, among others. The processor of the computing device 260 compares the received signals to determine if there is a current leakage in the portion of one or more cables 216 disposed between the two leakage detectors 220A, 220B. If the incoming current I1 is equal to the outgoing current I2, the digital signals will be substantially equal, indicating that there is no leakage of current between the first leakage detector 220A and the second leakage detector 220B. If the incoming current I1 is not equal to the outgoing current I2, the first and second received signals will not be equal, indicating a leakage current I3 in a particular cable tray 210 between the identified first and second detection sensors 220A, 220B. If a leakage current I3 is detected based on the signals from the first and second leakage detectors 220A, 220B, the central computing device 260 may generate an alarm signal (e.g., visual and/or auditory alarm 300) to indicate to the technician that leakage current I3 exists. The computing device 260 may be configured to provide information to the operator/technician including the location of the leakage and other information pertaining to the leakage.

The described leakage current detection system is suitable for both AC and DC currents, and does not depend on the direction of the current, but on the magnitude of current entering the longitudinal portion of the cable(s) between the incoming and outgoing leakage detectors. The leakage detectors 220A, 220B can be integrated with battery and wireless systems for monitoring. Accuracy can be increased by putting multiple leakage detectors at spaced intervals along the cable tray run.

What is claimed is:

1. A cable tray assembly comprising:
a cable tray run having a base portion, opposing side walls extending from the base, and a length, wherein the cable tray run is configured to support one or more electrical cables;
a first leakage detector disposed at a first longitudinal location of the cable tray run, the first leakage detector including a first magnetic sensor, wherein in use the first leakage detector is configured to sense magnetic flux generated by current flowing through the one or more electrical cables adjacent the first leakage detector; and
a second leakage detector disposed at a second longitudinal location of the cable tray run, the second leakage detector including a second magnetic sensor, wherein in use the second leakage detector is configured to sense magnetic flux generated by current flowing through the one or more electrical cables adjacent the second leakage detector,
wherein the first and second longitudinal locations are spaced apart from one another along the length of the cable tray run,
wherein the first leakage detector further includes a first electrical conductor coupled to the first magnetic sensor,
wherein the second leakage detector further includes a second electrical conductor coupled to the second magnetic sensor,
wherein each of the first and second electrical conductors extends around the cable tray run in a direction generally transverse to the length of the cable tray run.

2. The cable tray assembly set forth in claim 1, wherein each of the first and second magnetic sensors comprises a Hall-effect sensor.

3. The cable tray assembly set forth in claim 1, wherein each of the first and second electrical conductors extends generally in a loop around the cable tray run.

4. The cable tray assembly set forth in claim 1, wherein longitudinal ends of the first and second electrical conductors are coupled to the corresponding one of the first and second magnetic sensors.

5. The cable tray assembly set forth in claim 1, wherein each of the first and second electrical conductors comprises an insulated electrical conductor.

6. The cable tray assembly set forth in claim 1, further comprising a central computing device configured to receive: i) a first signal from the first leakage detector indicative of the magnetic flux generated by current flowing through the one or more electrical cables adjacent the first leakage detector, and ii) a second signal from the second leakage detector indicative of the magnetic flux generated by current flowing through the one or more electrical cables adjacent the second leakage detector, wherein the central computing device is configured to compare the first and second signals to determine if there is leakage current from the one or more electrical cables in the cable tray run.

7. The cable tray assembly set forth in claim 6, wherein the central computing device is configured to determine there is leakage current if the magnetic flux indicated by the first signal and the magnetic flux indicated by the second signal are not substantially equal to one another.

8. The cable tray assembly set forth in claim 6, further comprising an alarm in communication with the central computing device, wherein the central computing device is configured to activate the alarm if the central computing device determines there is leakage current from the one or more electrical cables in the cable tray run.

9. The cable tray assembly set forth in claim 6, wherein the first and second leakage detectors are in wired or wireless communication with the central computing device.

10. The cable tray assembly set forth in claim 1, wherein the first and second leakage detectors are battery operated.

11. The cable tray assembly set forth in claim 1, further comprising the one or more electrical cables received in the cable tray run.

12. A cable tray assembly comprising:
a cable tray run having a base portion, opposing side walls extending from the base, and a length, wherein the cable tray run is configured to support one or more electrical cables;
a first leakage detector configured to be disposed at a first longitudinal location of the cable tray run, the first leakage detector including a first magnetic sensor and a first electrical conductor coupled to the first magnetic sensor, wherein in use the first leakage detector is configured to sense magnetic flux generated by current flowing through the one or more electrical cables adjacent the first leakage detector, wherein the first electrical conductor extends around the cable tray run in a direction generally transverse to the length of the cable tray run;
a second leakage detector configured to be disposed at a second longitudinal location of the cable tray run, the second leakage detector including a second magnetic sensor and a second electrical conductor coupled to the second magnetic sensor, wherein in use the second leakage detector is configured to sense magnetic flux generated by current flowing through the one or more electrical cables adjacent the second leakage detector, wherein the second electrical conductor extends around the cable tray run in a direction generally transverse to the length of the cable tray run; and
a central computing device configured to receive: i) a first signal from the first leakage detector indicative of the magnetic flux generated by current flowing through the one or more electrical cables adjacent the first leakage detector, and ii) a second signal from the second leakage detector indicative of the magnetic flux generated by current flowing through the one or more electrical cables adjacent the second leakage detector, wherein the central computing device is configured to compare the first and second signals to determine if there is leakage current from the one or more electrical cables in the cable tray run.

13. The cable tray assembly leakage detection system set forth in claim 12, wherein the central computing device is configured to determine there is leakage current if the magnetic flux indicated by the first signal and the magnetic flux indicated by the second signal are not substantially equal to one another.

14. The cable tray assembly leakage detection system set forth in claim 12, further comprising an alarm in communication with the central computing device, wherein the central computing device is configured to activate the alarm if the central computing device determines there is leakage current from the one or more electrical cables in the cable tray run.

15. The cable tray assembly leakage detection system set forth in claim 12, wherein the first and second leakage detectors are in wireless communication with the central computing device.

16. A cable tray assembly comprising:
a cable tray run having a base portion, opposing side walls extending from the base, and a length, wherein the cable tray run is configured to support one or more electrical cables;
an electrical conductor configured to extend around the cable tray run generally transverse to a length of the cable tray run; and
a magnetic sensor coupled to the electrical conductor,
wherein in use the cable tray assembly is configured to sense magnetic flux generated by current flowing through the one or more electrical cables adjacent the cable tray assembly.

17. The cable tray assembly set forth in claim 16, wherein the magnetic sensor is a Hall-effect sensor.

* * * * *